(12) United States Patent
Lin et al.

(10) Patent No.: US 10,727,202 B2
(45) Date of Patent: *Jul. 28, 2020

(54) PACKAGE STRUCTURE

(71) Applicant: MEDIATEK INC., Hsin-Chu (TW)

(72) Inventors: Tzu-Hung Lin, Hsinchu County (TW); Yu-Hua Huang, Hsinchu (TW); Wei-Che Huang, Hsinchu County (TW); Ming-Tzong Yang, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/347,803

(22) Filed: Nov. 10, 2016

(65) Prior Publication Data

US 2017/0062388 A1 Mar. 2, 2017

Related U.S. Application Data

(63) Continuation of application No. 14/040,732, filed on Sep. 30, 2013, now Pat. No. 9,524,948.

(51) Int. Cl.
*H01L 23/48* (2006.01)
*H01L 25/065* (2006.01)
(Continued)

(52) U.S. Cl.
CPC .......... *H01L 25/0657* (2013.01); *H01L 24/16* (2013.01); *H01L 24/32* (2013.01);
(Continued)

(58) Field of Classification Search
CPC ..... H01L 25/0657; H01L 25/18; H01L 24/16; H01L 24/32; H01L 24/48; H01L 24/73;
(Continued)

(56) References Cited

U.S. PATENT DOCUMENTS

2003/0110625 A1 6/2003 Fang
2004/0251531 A1 12/2004 Yang
(Continued)

FOREIGN PATENT DOCUMENTS

CN 1391278 A 1/2003
CN 1649149 A 8/2005
(Continued)

*Primary Examiner* — Timor Karimy
(74) *Attorney, Agent, or Firm* — Wolf, Greenfield & Sacks, P.C.

(57) ABSTRACT

A package structure comprising: a substrate, having at least one conductive units provided at a first surface of the substrate; at least one first die, provided on a second surface of the substrate; a connecting layer, provided on the first die; a second die, provided on the connecting layer, wherein the connecting layer comprises at least one bump for connecting the first die; and at least one bonding wire. The connecting layer has a first touch side and a second touch side, the first touch side contacts a first surface of the first die and the second touch side contacts a second surface of the second die, an area of the first touch side is smaller than which for the first surface of the first die, and a size of the first die equals to which of the second die.

20 Claims, 8 Drawing Sheets

(51) Int. Cl.
*H01L 23/00* (2006.01)
*H01L 25/18* (2006.01)

(52) U.S. Cl.
CPC .............. *H01L 24/48* (2013.01); *H01L 24/73* (2013.01); *H01L 25/18* (2013.01); *H01L 2224/16145* (2013.01); *H01L 2224/32014* (2013.01); *H01L 2224/32058* (2013.01); *H01L 2224/32105* (2013.01); *H01L 2224/32145* (2013.01); *H01L 2224/48227* (2013.01); *H01L 2224/73204* (2013.01); *H01L 2224/73207* (2013.01); *H01L 2224/73215* (2013.01); *H01L 2225/0651* (2013.01); *H01L 2225/06513* (2013.01); *H01L 2225/06562* (2013.01); *H01L 2225/06565* (2013.01); *H01L 2225/06568* (2013.01); *H01L 2924/00014* (2013.01); *H01L 2924/1431* (2013.01); *H01L 2924/1434* (2013.01); *H01L 2924/15311* (2013.01)

(58) Field of Classification Search
CPC . H01L 2224/16145; H01L 2224/32014; H01L 2224/32058; H01L 2224/32145; H01L 2224/48227; H01L 2224/73204; H01L 2224/73215; H01L 2225/0651; H01L 2225/06513; H01L 2225/06562; H01L 2225/06565; H01L 2225/06568; H01L 2924/00014; H01L 2928/1431; H01L 2924/1434; H01L 2924/15311

USPC ......... 257/737, 673, 678, E23.021, E23.033, 257/E23.068, E23.069, E21.508
See application file for complete search history.

(56) References Cited

U.S. PATENT DOCUMENTS

| | | |
|---|---|---|
| 2005/0170600 A1 | 8/2005 | Fukuzo |
| 2007/0057357 A1* | 3/2007 | Chen ........................ H01L 24/73 257/686 |
| 2007/0228543 A1 | 10/2007 | Walter |
| 2011/0180913 A1* | 7/2011 | Liou ........................ H01L 24/73 257/666 |
| 2012/0187560 A1 | 7/2012 | Choi et al. |
| 2012/0276691 A1 | 11/2012 | Camacho |
| 2013/0147025 A1 | 6/2013 | Liou |
| 2013/0161788 A1 | 6/2013 | Chun |
| 2014/0042600 A1 | 2/2014 | Kim |

FOREIGN PATENT DOCUMENTS

| | | |
|---|---|---|
| CN | 102136434 A | 7/2011 |
| CN | 103178054 A | 6/2013 |
| JP | 2007-207805 A | 8/2007 |
| WO | 2013105153 A1 | 7/2013 |
| WO | WO 2013/105153 A1 | 7/2013 |

* cited by examiner

PACKAGE STRUCTURE

CROSS REFERENCE TO RELATED APPLICATION

This application is a continuation application of applicant's earlier application, Ser. No. 14/040,732, filed 2013 Sep. 30, and is included herein by reference.

BACKGROUND

A wide I/O memory device is a memory device having pins more than other kinds of memory devices. The wide I/O memory device can have a rapid data accessing speed, since it has large number of pins to access data.

FIG. 1 is a cross sectional diagram illustrating a semiconductor structure for a related art wide I/O memory device. As shown in FIG. 1, the wide I/O memory device 100 has a memory cube MC and a logic die LI provided on a substrate Su. The memory cube MC comprises a plurality of memory dies MI. Vias VA (only one is marked by the symbol) are generated via a TSV (Through-Silicon Via) process, such that the memory cube MC and a logic die LI can be electrically connected to the conductive units Cu (ex. solder ball) or the substrate Su. However, the I/O memory device needs plenty of vias since it has many pins, but the TSV process causes high cost. Therefore, the cost for the I/O memory device is extremely high.

SUMMARY

Therefore, one objective of the present application is to provide a package structure that can be generated without the TSV process.

One embodiment of the present application provides a package structure, which comprises: a substrate, having at least one conductive units provided at a first surface of the substrate; at least one first die, provided on a second surface of the substrate; a connecting layer, provided on the first die; a second die, provided on the connecting layer, wherein the connecting layer comprises at least one bump for connecting the first die to the second die such that the first die and the second die are electrically connected; and at least one bonding wire, for electrically connecting the first die to the conductive units or the substrate. The connecting layer has a first touch side and a second touch side, the first touch side contacts a first surface of the first die and the second touch side contacts a second surface of the second die, an area of the first touch side is smaller than which for the first surface of the first die, and a size of the first die equals to which of the second die.

Another embodiment of the present application provides a package structure, which comprises: a substrate, having at least one conductive units provided at a first surface of the substrate; at least one first die, provided on a second surface of the substrate; a connecting layer, provided on the first die; a second die, provided on the connecting layer, wherein the connecting layer comprises at least one bump for connecting the first die to the second die such that the first die and the second die are electrically connected; and at least one bonding wire, for electrically connecting the first die to the conductive units or the substrate. A location for the first die or the second die is shifted.

In view of above-mentioned embodiments, a package structure can be produced without performing TSV processes. Therefore, the cost can be largely reduced.

These and other objectives of the present invention will no doubt become obvious to those of ordinary skill in the art after reading the following detailed description of the preferred embodiment that is illustrated in the various figures and drawings.

DETAILED DESCRIPTION

The package structure according to the present application will be explained for detail below. Please note the package structure according to the present application is not only can be applied to the above-mentioned wide I/O memory device, but also can be applied to other electronic devices.

Figure 1:
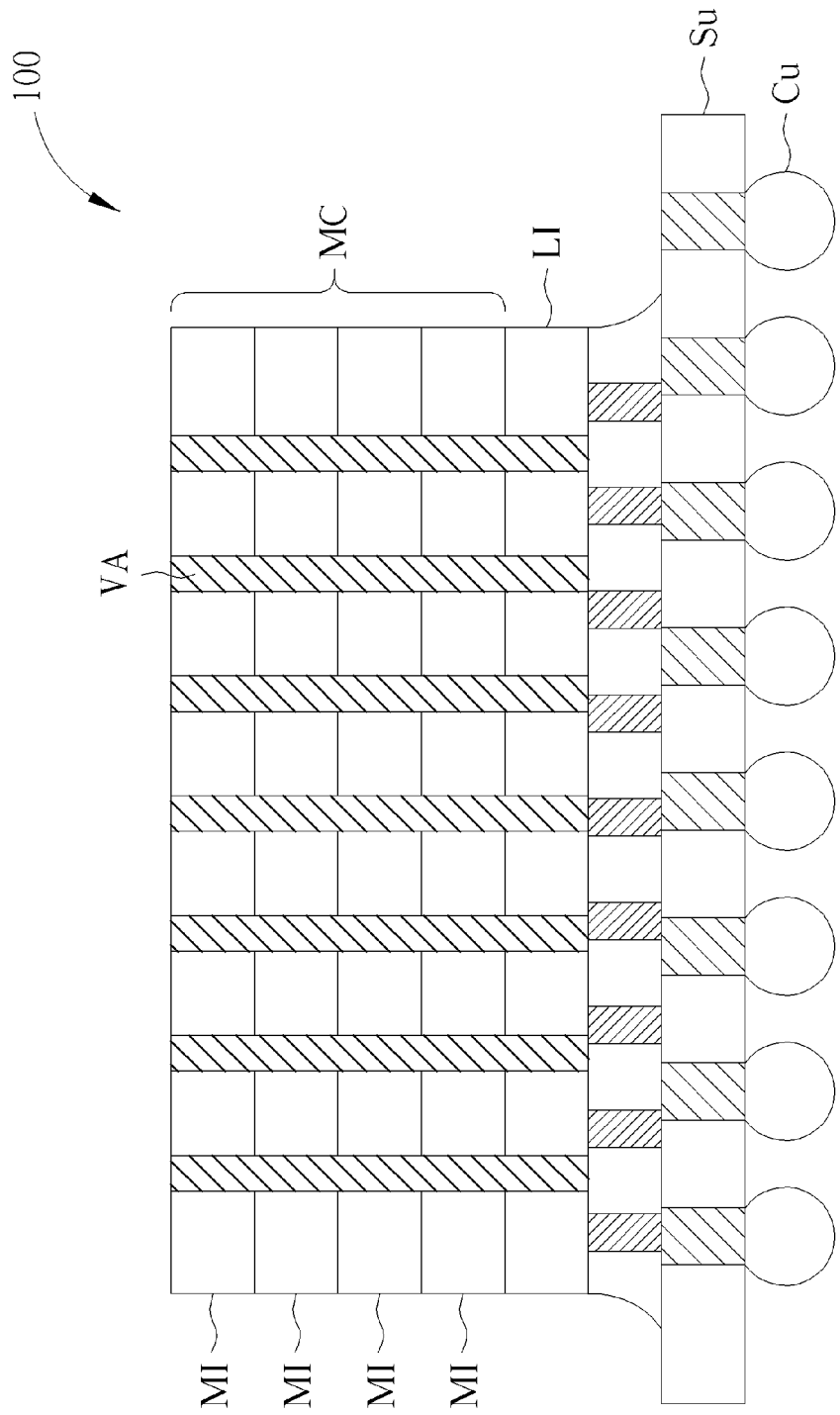
FIG. 1 is a cross sectional diagram illustrating a semiconductor structure for a related art wide I/O memory device.
Figure 2:
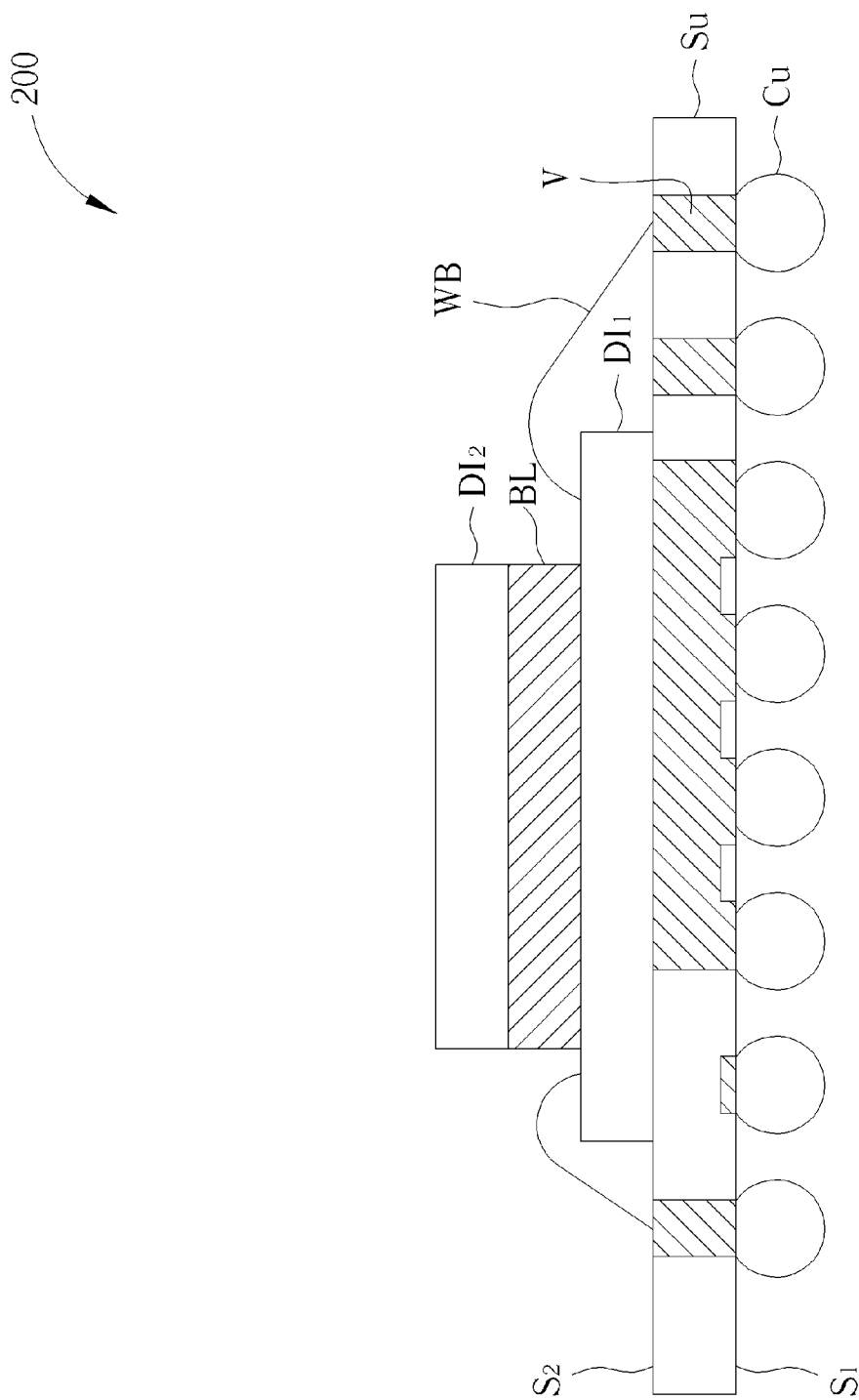
FIG. 2 is a cross sectional diagram illustrating a package structure according to one embodiment of the present application.

FIG. 2 is a cross sectional diagram illustrating a package structure 200 according to one embodiment of the present application.

As shown in FIG. 2, the package structure 200 comprises a substrate Su, a first die $DI_1$, a connecting layer BL, a second die $DI_2$ and at least one bonding wire WB. The substrate Su having at least one conductive unit Cu (only one of them is marked by a symbol) provided on a first surface $S_1$ thereof. The first die $DI_1$ is provided on a second surface $S_2$ of the substrate Su. The connecting layer BL is provided on the first die $DI_1$, and is for electrically bumping the first die $DI_1$ to the second die $DI_2$. In one embodiment, the connecting layer BL comprises at least one bump for electrically connecting the first die $DI_1$ to the second die $DI_2$. The at least one bonding wire WB is for connecting the first die $DI_1$ and the conductive units Cu, or connecting the first die $DI_1$ and the substrate Su. In one embodiment, the bonding wire WB is connected to via V formed in the substrate Su, which is electrically connected to the conductive unit Cu, but is not limited. Also, in the embodiment illustrated in FIG. 2, the size of the first die $DI_1$ is larger than which of the second die $DI_2$.

Figure 3:
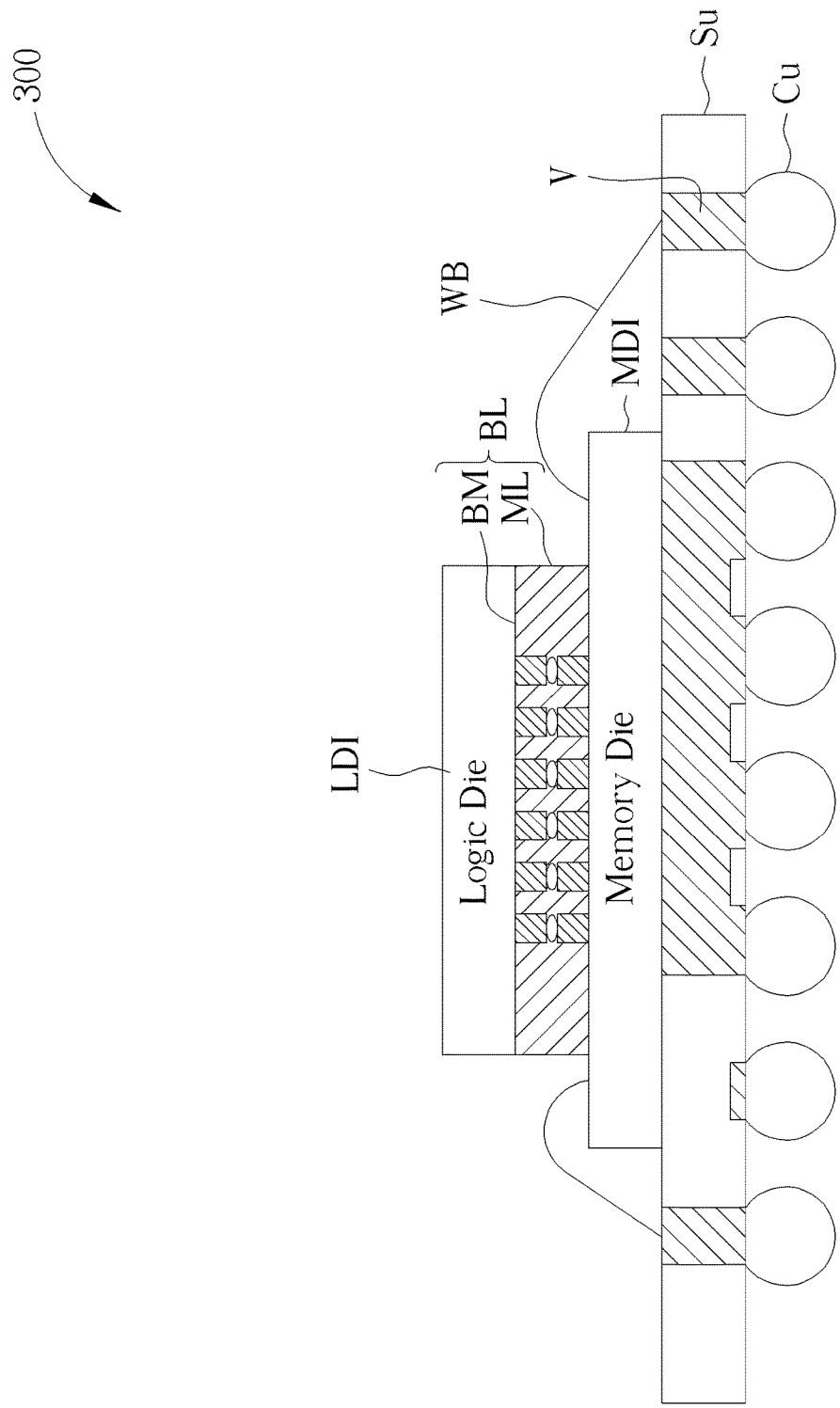
FIG. 3 is a cross sectional diagram illustrating detail structures for the embodiment shown in FIG. 2 of the present application.

FIG. 3 is a cross sectional diagram illustrating detail structures for the embodiment shown in FIG. 2 of the present application. As shown in FIG. 3, the first die of the package structure 300 is a memory die MDI and the second die is a logic die LDI. Please note the kinds of dies can be swapped. That is, the first die can be a logic die LDI and the second die can be a memory die MDI. Additionally, in one embodiment the connecting layer BL is generated via a flip chip process. In another embodiment, the connecting layer BL comprises a metal layer ML located between the memory die MDI and the logic die LDI, and at least one micro bump BM for connecting the memory die MDI and the logic die LDI. Also, in such embodiment, the metal layer ML is a redistribution layer (RDL). Please note the package structure according to the present application can include only part of the structures described in FIG. 3. For example, the first die and the second die can be other kinds of dies besides the memory die and the logic die, but the connecting layer BL can still comprise a metal layer ML, and the micro bump BM.

FIG. 4-FIG. 8 are cross sectional diagrams illustrating a package structure according to different embodiments of the present application.

Figure 4:
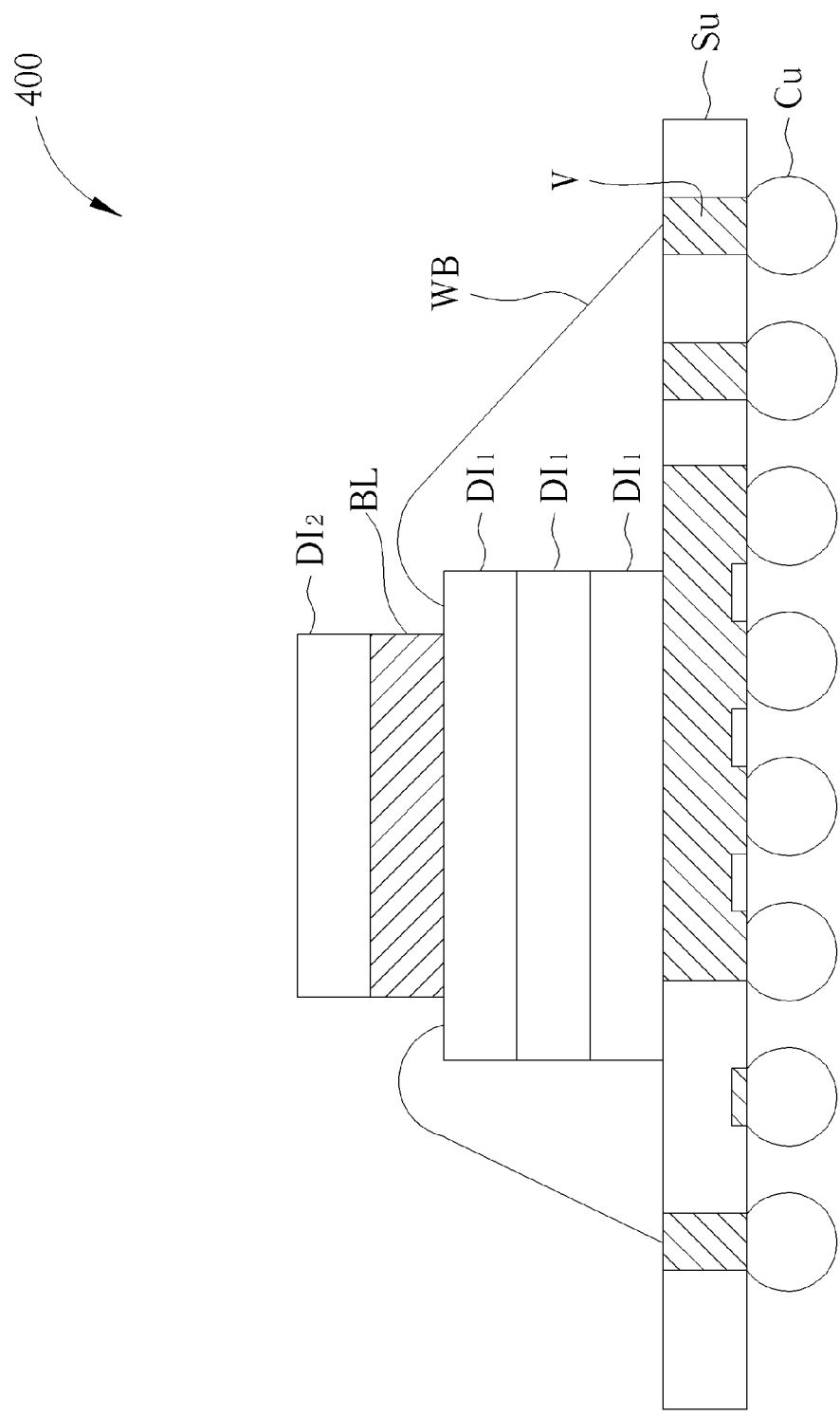
FIG. 4-FIG. 8 are cross sectional diagrams illustrating a package structure according to different embodiments of the present application.

In FIG. 4, the package structure 400 comprises more than one first die $DI_1$ located between the connecting layer BL and the substrate Su. If the package structure 400 is a wide I/O memory device, the first dies can be memory dies to form a memory cube.

Figure 5:
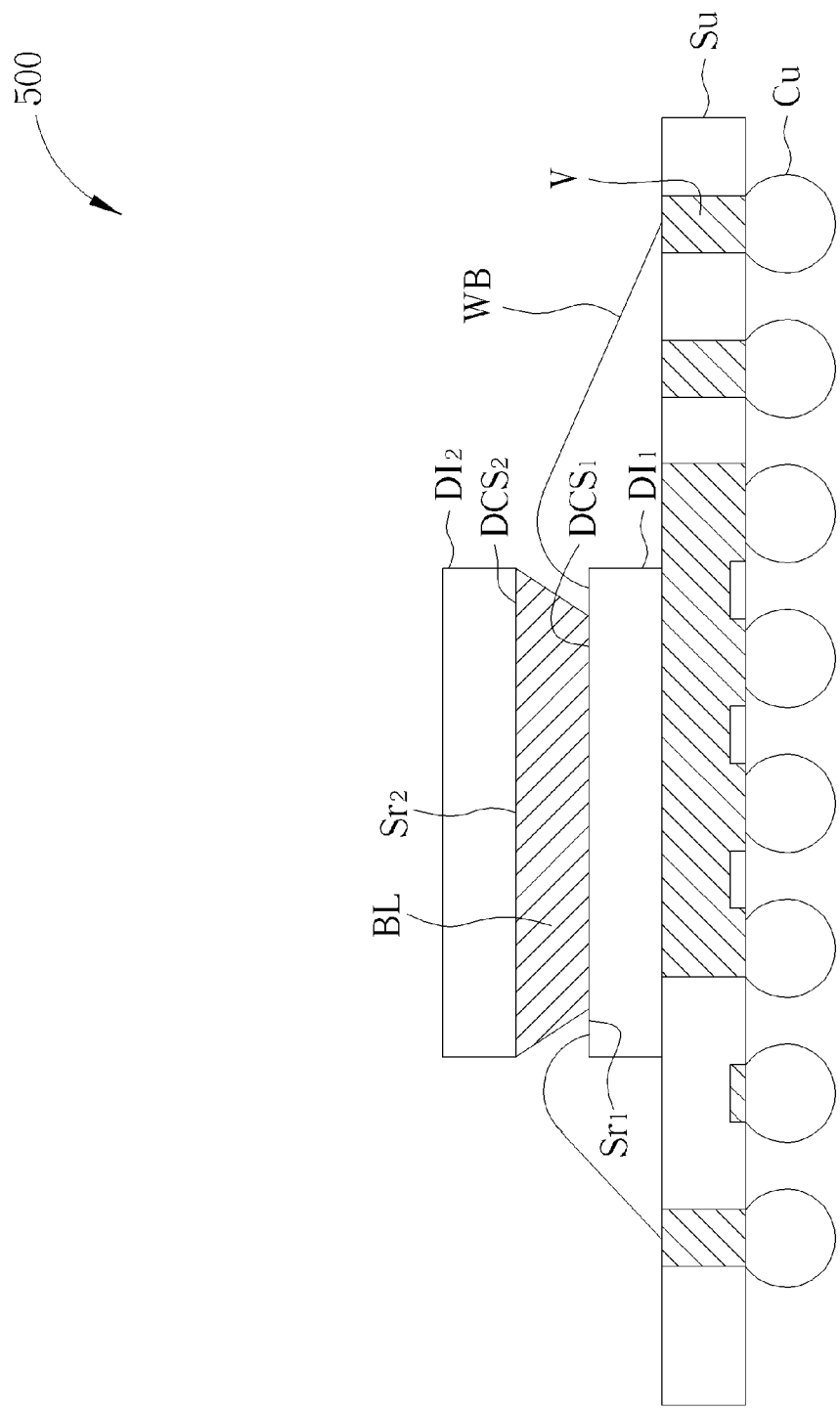

In the package structure 500 of FIG. 5, the sizes of the first die $DI_1$ and the second die $DI_2$ are the same, and the connecting layer BL has a first touch side $DCS_1$ and a second touch side $DCS_2$. The first touch side $DCS_1$ contacts a first surface $Sr_1$ of the first die $DI_1$ and the second touch side $DCS_2$ contacts a second surface $Sr_2$ of the second die $DI_2$. Also, in FIG. 5 an area of the first touch side $DCS_1$ is smaller than which for the first surface $Sr_1$ of the first die $DI_1$, and an area of the second touch side $DCS_2$ equals to which for the second surface $Sr_2$ of the second die $DI_2$.

Figure 6:
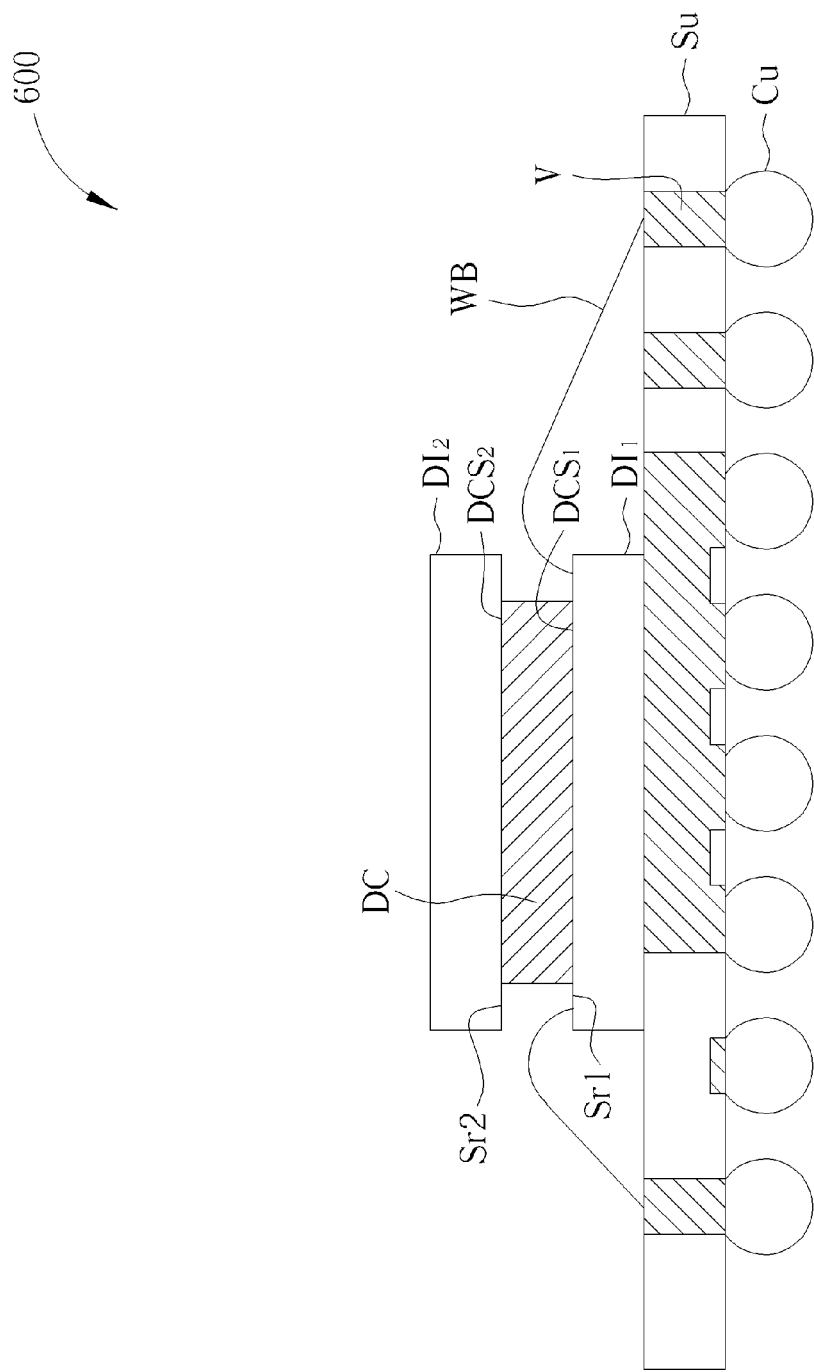

The structure shown in FIG. 6 is almost the same as which of FIG. 5, one difference is that the area of the second touch side $DCS_2$ equals to which for the second surface $Sr_2$ of the second die $DI_2$ for the package structure 500 in FIG. 5, but the area for the second touch side $DCS_2$ is smaller than which for the second surface $Sr_2$ of the second die $DI_2$ for the package structure 600 in FIG. 6.

Figure 7:
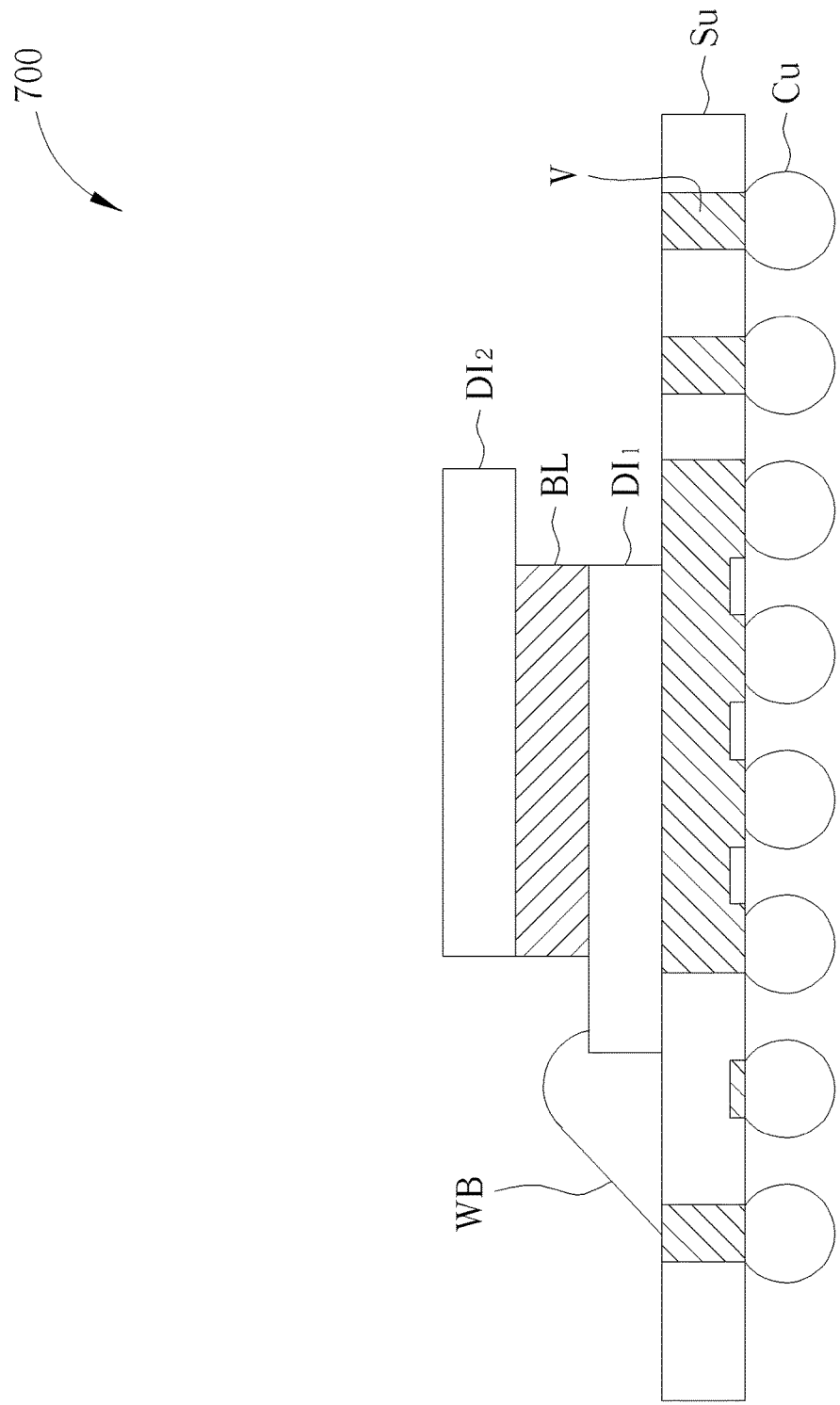
Figure 8:
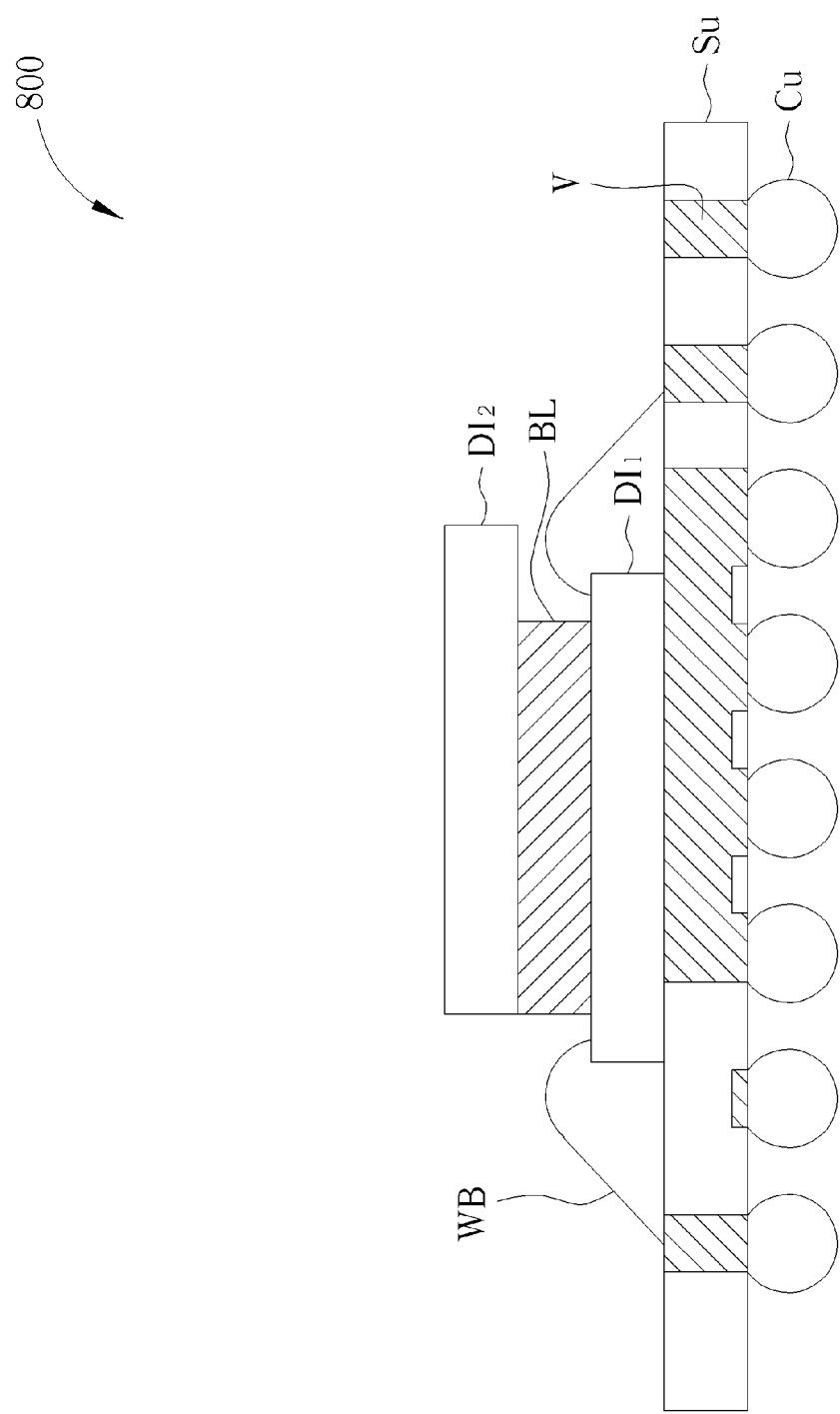

In the embodiments described in FIG. 7 and FIG. 8, the sizes of the first die $DI_1$ and the second die $DI_2$ are the same as well, but the location for the first die $DI_1$ or the second die $DI_2$ is shifted such that a projected image of the second die $DI_2$ does not totally contain the first die $DI_1$. In the embodiment described in FIG. 7, bonding wire WB is only provided to one side of the first die $DI_1$. In the embodiment described in FIG. 8, bonding wires WB are provided to two sides of the first die $DI_1$.

Please note the structure illustrated in FIG. 3 can also be applied the embodiments described in FIG. 4-FIG. 8.

In view of above-mentioned embodiments, a package structure can be produced without performing TSV processes. Therefore, the cost can be largely reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
   a substrate, having a plurality of conductive units provided at a first surface of the substrate;
   a first die, provided on a second surface of the substrate;
   a connecting layer, provided on the first die;
   a second die, provided on the connecting layer, wherein the connecting layer comprises a bump for connecting the first die to the second die such that the first die and the second die are electrically connected; and
   a bonding wire, for electrically connecting the first die to the plurality of conductive units or the substrate;
   wherein the connecting layer has a first touch side and a second touch side, wherein the first touch side contacts a first surface of the first die and the second touch side contacts a second surface of the second die, wherein an edge of the second touch side of the connecting layer is aligned with an edge of the second surface of the second die, and wherein an area of the first touch side is smaller than an area of the first surface of the first die, wherein a size of the first die equals to a size of the second die.

2. The package structure of claim 1, wherein the first die is a memory die and the second die is a logic die.

3. The package structure of claim 1, wherein the first die is a logic die and the second die is a memory die.

4. The package structure of claim 1, wherein an area of the second touch side equals to an area for the second surface of the second die.

5. The package structure of claim 1, wherein a projected image of the second die does not totally contain the first die.

6. The package structure of claim 5, wherein a location for the first die or the second die is shifted.

7. The package structure of claim 6, wherein the bonding wire is only provided at one side of the first die.

8. The package structure of claim 6, wherein the bonding wire is provided at two sides of the first die.

9. The package structure of claim 1, wherein the connecting layer is generated via a flip chip process.

10. A package structure, comprising:
    a substrate, having a plurality of conductive units provided at a first surface of the substrate;
    a first die, provided on a second surface of the substrate;
    a connecting layer, provided on the first die;
    a second die, provided on the connecting layer, wherein the connecting layer comprises a bump for connecting the first die to the second die such that the first die and the second die are electrically connected;
    and a bonding wire, for electrically connecting the first die to the plurality of conductive units or the substrate;
    wherein the connecting layer has a first touch side and a second touch side, wherein the first touch side contacts a first surface of the first die and the second touch side contacts a second surface of the second die, wherein an edge of the second touch side of the connecting layer is aligned with an edge of the second surface of the second die, and
    wherein a location for the first die or the second die is shifted.

11. The package structure of claim 10, wherein the first die is a memory die and the second die is a logic die.

12. The package structure of claim 10, wherein the first die is a logic die and the second die is a memory die.

13. The package structure of claim 10, wherein a size of the first die is larger than which of the second die.

14. The package structure of claim 10, wherein a size of the first die equals to a size of the second die.

15. The package structure of claim 10, wherein the connecting layer has a first touch side and a second touch side, wherein the first touch side contacts a first surface of the first die and the second touch side contacts a second surface of the second die, where an area of the first touch side is smaller than the first surface of the first die.

16. The package structure of claim 10, where an area of the second touch side equals to an area of the second surface of the second die.

17. The package structure of claim 10, where an area of the second touch side is smaller than an area of the second surface of the second die.

18. The package structure of claim 10, wherein a projected image of the second die does not totally contain the first die.

19. The package structure of claim 10, wherein the bonding wire is only provided at one side of the first die.

20. The package structure of claim 10, wherein the connecting layer comprises:

a metal layer located between the first die and the second die, wherein part of the metal layer comprises metal; and at least one micro bump, for connecting the first die and the second die.

* * * * *

UNITED STATES PATENT AND TRADEMARK OFFICE
CERTIFICATE OF CORRECTION

PATENT NO. : 10,727,202 B2
APPLICATION NO. : 15/347803
DATED : July 28, 2020
INVENTOR(S) : Tzu-Hung Lin et al.

It is certified that error appears in the above-identified patent and that said Letters Patent is hereby corrected as shown below:

In the Claims

Column 3, Claim 1, Line 53, should read:
a first die, provided directly on a second surface of the substrate;

Column 3, Claim 1, Line 55, should read:
a second die, provided directly on the connecting layer, wherein Column 4, Claim 10, Line 24, should read:
a first die, provided directly on a second surface of the substrate;

Column 4, Claim 10, Line 26, should read:
a second die, provided directly on the connecting layer, wherein Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*